(12) United States Patent
Lee et al.

(10) Patent No.: US 7,759,141 B2
(45) Date of Patent: Jul. 20, 2010

(54) METHOD OF MANUFACTURING DISPLAY DEVICE

(75) Inventors: Dae-Woo Lee, Suwon-si (KR);
Do-Hyun Kwon, Suwon-si (KR);
Hyun-Eok Shin, Suwon-si (KR);
Ji-Yong Noh, Suwon-si (KR); Dae-Woo Kim, Suwon-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 10 days.

(21) Appl. No.: 12/155,237

(22) Filed: May 30, 2008

(65) Prior Publication Data
US 2009/0137074 A1 May 28, 2009

(30) Foreign Application Priority Data
Nov. 22, 2007 (KR) .................. 10-2007-0119756

(51) Int. Cl.
*H01L 21/00* (2006.01)
(52) U.S. Cl. ................. 438/22; 257/E21.007; 313/504; 313/505; 313/50
(58) Field of Classification Search ............. 438/22; 257/E21.007; 313/504–506
See application file for complete search history.

(56) References Cited

U.S. PATENT DOCUMENTS

2004/0178411 A1* 9/2004 Misaki et al. ............ 257/72
2004/0245531 A1* 12/2004 Fuii et al. ................ 257/88

FOREIGN PATENT DOCUMENTS

| KR | 2002-0097420 | 12/2002 |
| KR | 2005-0045768 | 5/2005 |
| KR | 2005-0113039 | 12/2005 |
| KR | 2007-0034769 | 3/2007 |

* cited by examiner

*Primary Examiner*—Davienne Monbleau
*Assistant Examiner*—Matthew Reames
(74) *Attorney, Agent, or Firm*—Robert E. Bushnell, Esq.

(57) ABSTRACT

A method of manufacturing a display device includes: preparing a substrate including a first area and a second area, forming a first layer on the first area and the second area, forming a second layer on the first layer of the first area, respectively forming a first electrode layer on the second layer of the first area and the first layer of the second area, forming a reflective layer on the first electrode layer of the first area, and forming a second electrode layer on the reflective layer.

14 Claims, 5 Drawing Sheets

METHOD OF MANUFACTURING DISPLAY DEVICE

CLAIM FOR PRIORITY

This application makes reference to, incorporates the same herein, and claims all benefits accruing under 35 U.S.C. §119 from an application for *METHOD FOR MANUFACTURING AN DISPLAY DEVICE* earlier filed in the Korean Intellectual Property Office on the 22 Nov. 2007 and there duly assigned Serial No. 10-2007-0119756.

BACKGROUND OF THE INVENTION

1. Field of the Invention

The present invention relates to a method of manufacturing a display device. More particularly, the present invention relates to a method of manufacturing a dual-side light emitting display device.

2. Description of the Related Art

Among various display panels for a display device, a display panel using an Organic Light Emitting Diode (OLED) has been receiving attention according to the rapid advance of semiconductor technology.

An active matrix OLED display includes a plurality of pixels arranged on a substrate in a matrix form and Thin Film Transistors (TFT) disposed at each of the pixels, such that each of the pixels is independently controlled by the TFTs.

The OLED display is classified as a top light emitting OLED, a bottom light emitting OLED, and a dual-side light emitting OLED according to a direction of light emitted from an organic light emitting element thereof, and different materials are used in a pixel electrode of the OLED display according to the emission types. The dual-side light emitting OLED display simultaneously emits light from top and bottom surfaces of one display panel, it may increase luminance while respectively realizing various images, and therefore it has been spotlighted as a next generation display device.

However, a manufacturing process thereof is complicated since a top light emitting element and a bottom light emitting element are required to be formed on a display area.

SUMMARY OF THE INVENTION

The present invention has been made in an effort to provide a method of manufacturing a dual-side light emitting display device.

According to an exemplary embodiment of the present invention, in a method of manufacturing a display device, a substrate including a first area and a second area is prepared, a first layer is formed on the first area and the second area, a second layer is formed on the first layer of the first area, a first electrode layer is respectively formed on the second layer of the first area and the first layer of the second area, a reflective layer is formed on the first electrode layer of the first area, and a second electrode layer is formed on the reflective layer.

Light emitting directions of the first and second areas may be opposite to each other.

The first and second electrode layers of the first area may be formed of a transparent material.

The first electrode layers formed in the first and second areas may be respectively formed of a transparent material.

The first electrode layer of the first area may be thicker than the second electrode layer.

The reflective layer may be formed of aluminum (Al), molybdenum (Mo), titanium (Ti), silver (Ag), magnesium (Mg), or gold (Au), or an alloy including at least one of them.

The display device may include a first pixel electrode, an organic emission layer, and a second pixel electrode. The first pixel electrode includes the first electrode layer, the reflective layer, and the second electrode layer of the first area. The organic emission layer is formed on the first pixel electrode, the second pixel electrode is formed on the organic emission layer, and the second pixel electrode may be formed of a transparent material The display device may include a first pixel electrode, an organic emission layer, and a second pixel electrode. The first pixel electrode includes the first electrode layer of the second area, the organic emission layer is formed on the first pixel electrode, and the second pixel electrode is formed on the organic emission layer. The second pixel electrode may be formed of an opaque material.

In the manufacturing method, a TFT may be respectively formed on the substrate in the first and second areas.

The first layer may be a passivation layer formed on the substrate while covering the TFTs.

The second layer may be a planarization layer formed on the passivation layer.

In the method of manufacturing the display device according to the exemplary embodiment of the present invention, since the top light emitting area and the bottom light emitting area are simultaneously formed on one substrate, and a first pixel electrode of the bottom light emitting area may be formed to be thicker, efficiency of an electrode increases, and a manufacturing process thereof may be simplified.

DETAILED DESCRIPTION OF THE INVENTION

Figure 1A:
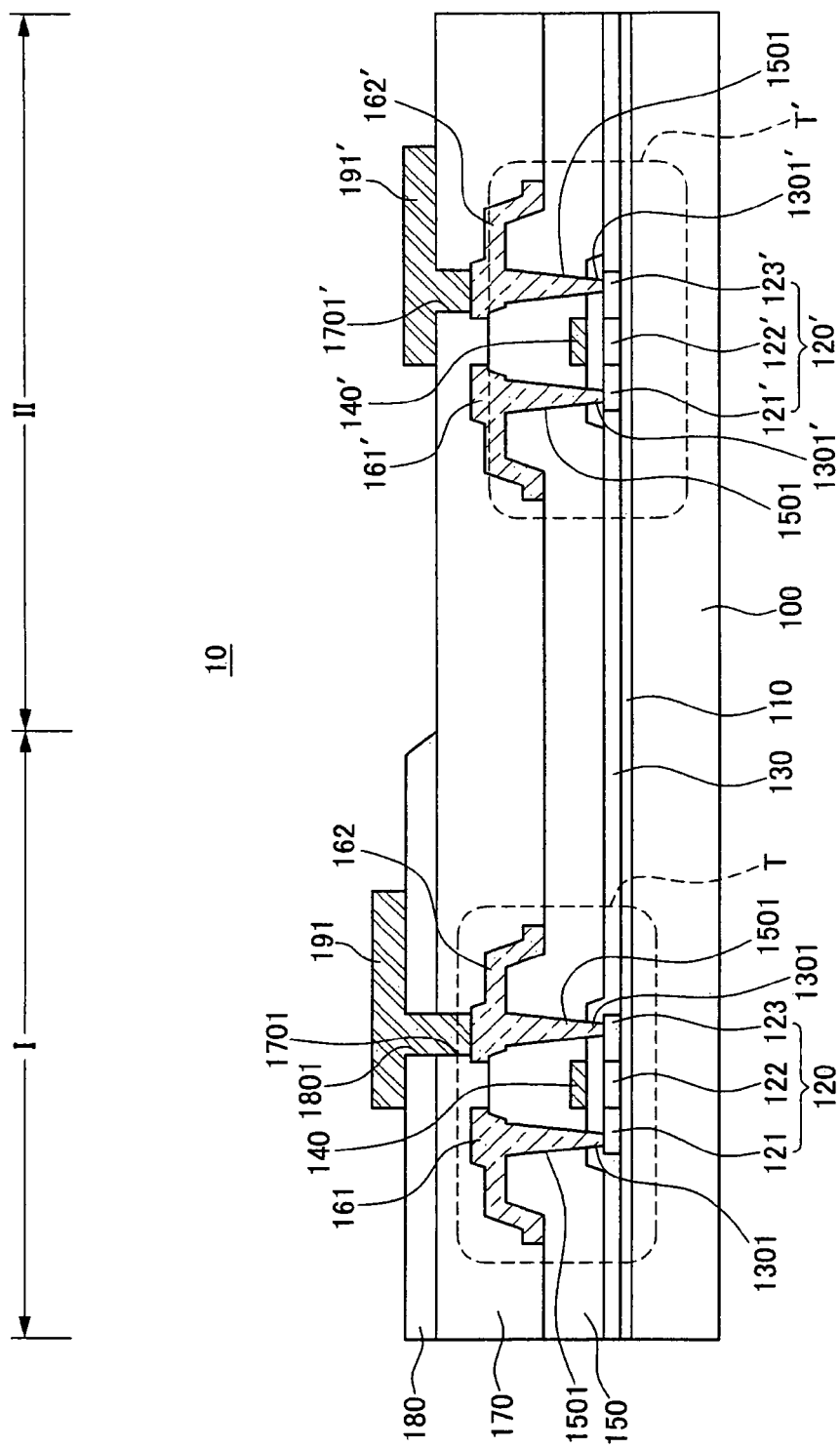
FIG. 1A to FIG. 1E are cross-sectional views of a display device during sequential steps for its manufacture according to an exemplary embodiment of the present invention.

The present invention is described more fully hereinafter with reference to the accompanying drawings, in which an exemplary embodiment of the present invention is shown. As those skilled in the art would realize, the described embodiment may be modified in various different ways, all without departing from the spirit or scope of the present invention.

Accordingly, the drawings and description are to be regarded as illustrative in nature and not restrictive. Like reference numerals designate like elements throughout the specification.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising" will be understood to imply the inclusion of stated elements but not the exclusion of any other elements.

FIG. 1A to FIG. 1E are cross-sectional views of a display device during sequential steps for its manufacture according to an exemplary embodiment of the present invention.

The display device 10 includes a top light emitting area in which light is emitted from an organic light emitting element in an opposite direction of a substrate in which a TFT is formed, and a bottom light emitting area in which the light is emitted from the organic light emitting element in a direction of the substrate in which the TFT is formed.

Referring to FIG. 1A, a buffer layer 110 is commonly formed on a top surface of a substrate 100 in a first area I that is the top light emitting area and a second area II that is the bottom light emitting area. The buffer layer 110 prevents the spread of impurities of the substrate 100 to active layers 120 and 120' when the active layers 120 and 120' are formed. For example, the buffer layer 110 may be formed of a silicon nitride layer or a stacked layer of silicon nitride and silicon oxide.

The active layers 120 and 120' are formed on the buffer layer 110. The respective active layers 120 and 120' include source areas 121 and 121', drain areas 123 and 123', and channel areas 122 and 122' for connecting the source and drain areas 121 and 123, 121' and 123'.

A gate insulating layer 130 is formed on the buffer layer 110 while covering the active layers 120 and 120'. First contact holes 1301 and 1301' are formed in a part of the gate insulating layer 130 in an exposure/development process and an etching process using a mask.

Gate electrodes 140 and 140' are formed on the gate insulating layer 130 to correspond to centers of the active layers 120 and 120'. The gate electrodes 140 and 140' may be made of one material selected from the group consisting of, for example, MoW, Al, Cr, and Al/Cr.

An interlayer insulating layer 150 is formed on the gate insulating layer 130 while covering the gate electrodes 140 and 140', and second contact holes 1501 and 1501' are formed in a part of the interlayer insulating layer 150 in the exposure/development process and the etching process using a mask. Therefore, the source areas 121 and 121' and the drain areas 123 and 123' are exposed through the contact holes 1301, 1301', 1501, and 1501'.

Source electrodes 161 and 161' and drain electrodes 162 and 162' electrically connected to the source areas 121 and 121' and the drain areas 123 and 123' through the first contact holes 1301 and 1301' and the second contact holes 1501 and 1501' are formed on the interlayer insulating layer 150. The source electrode 161 and drain electrode 162 may be made of metal, for example Ti/Al or Ti/Al/Ti.

Therefore, TFTs T and T' are formed in the first area I and the second area II.

The organic light emitting element formed on the TFTs T and T' and partially connected to the TFTs T and T' are described below. The TFTs T and T' and the organic light emitting element form a unit pixel of the display device 10.

Firstly, a description of manufacturing process of a first pixel electrode, an organic emission layer, and a second pixel electrode included in the organic light emitting element follows. Since the display device 10 is a dual-side light emitting OLED, characteristics of the respective organic light emitting elements formed in the first area I and the second area II are different from each other.

Referring back to FIG. 1A, a passivation layer 170 is a first layer commonly formed on the top surface of the substrate 100 in the first area I and the second area II while covering the TFTs T and T'. First via holes 1701 and 1701' partially exposing the drain electrodes 162 and 162' of the first area I and the second area II are formed in the passivation layer 170.

Subsequently, a planarization layer 180 is a second layer formed on the passivation layer 170 of the first area I. A second via hole 1801 communicating with the first via hole 1701 of the passivation layer 170 is formed on the planarization layer 180. Since the passivation layer 170 has higher light transmittance than the planarization layer 180, an insulating layer may be formed by using the passivation layer 170 in the second area II that is the bottom light emitting area.

First electrode layers 191 and 191' are simultaneously formed on the planarization layer 180 of the first area I and the passivation layer 170 of the second area II. The first electrode layer 191 of the first area I is electrically connected to the drain electrode 162 of the TFT T through the first via hole 1701 and the second via hole 1801, and the first electrode layer 191' of the second area II is electrically connected to the drain electrode 162' of the TFT T' through the first via hole 1701'. The first electrode layers 191 and 191' may be transparent electrodes formed of Indium Tin Oxide (ITO), Indium Zinc Oxide (IZO), or Mg/Ag.

Figure 1B:
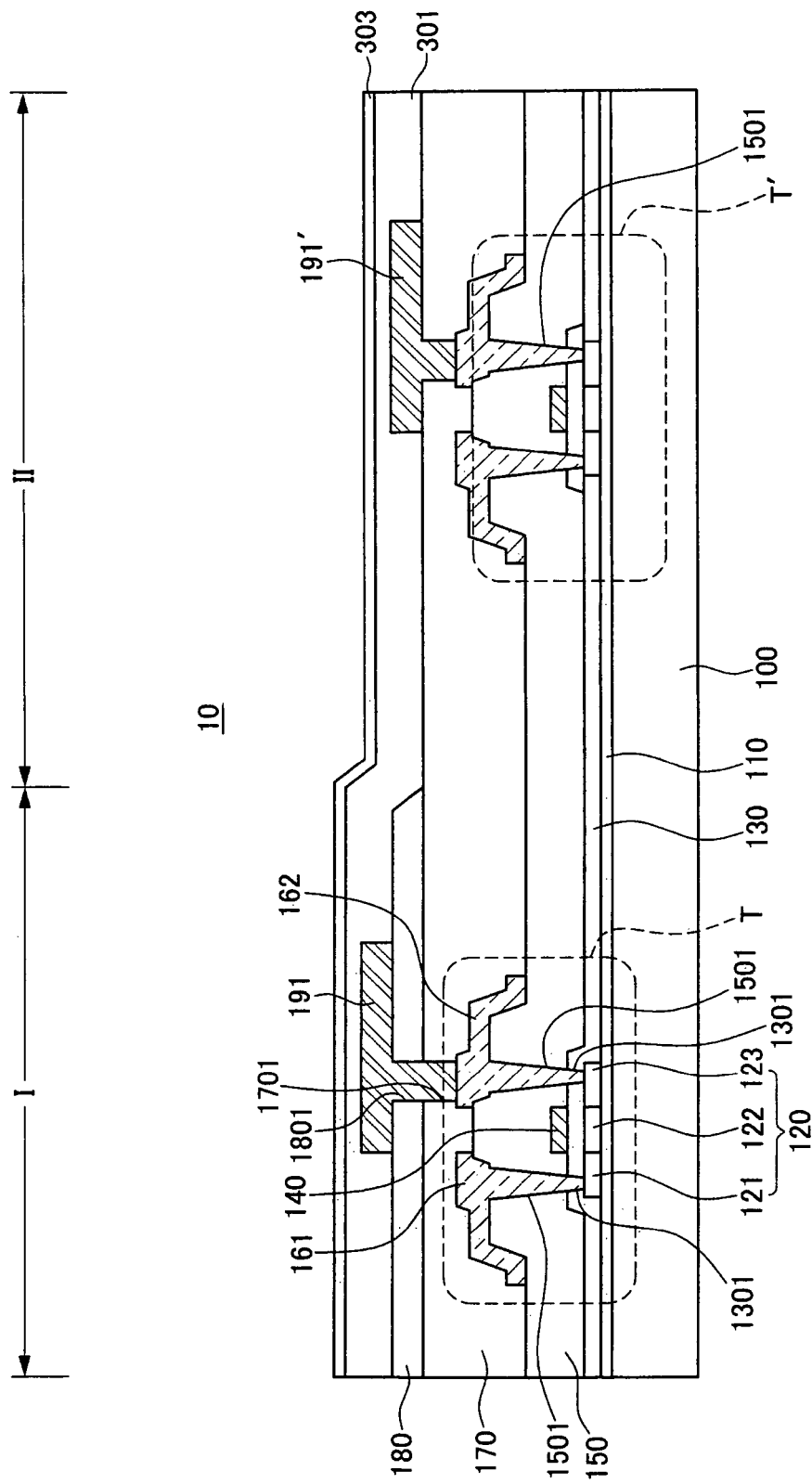

Referring to FIG. 1B, a reflective material layer 301 and a second electrode material layer 303 are formed while covering the first electrode layers 191 and 191' of the first area I and the second area II.

Figure 1C:
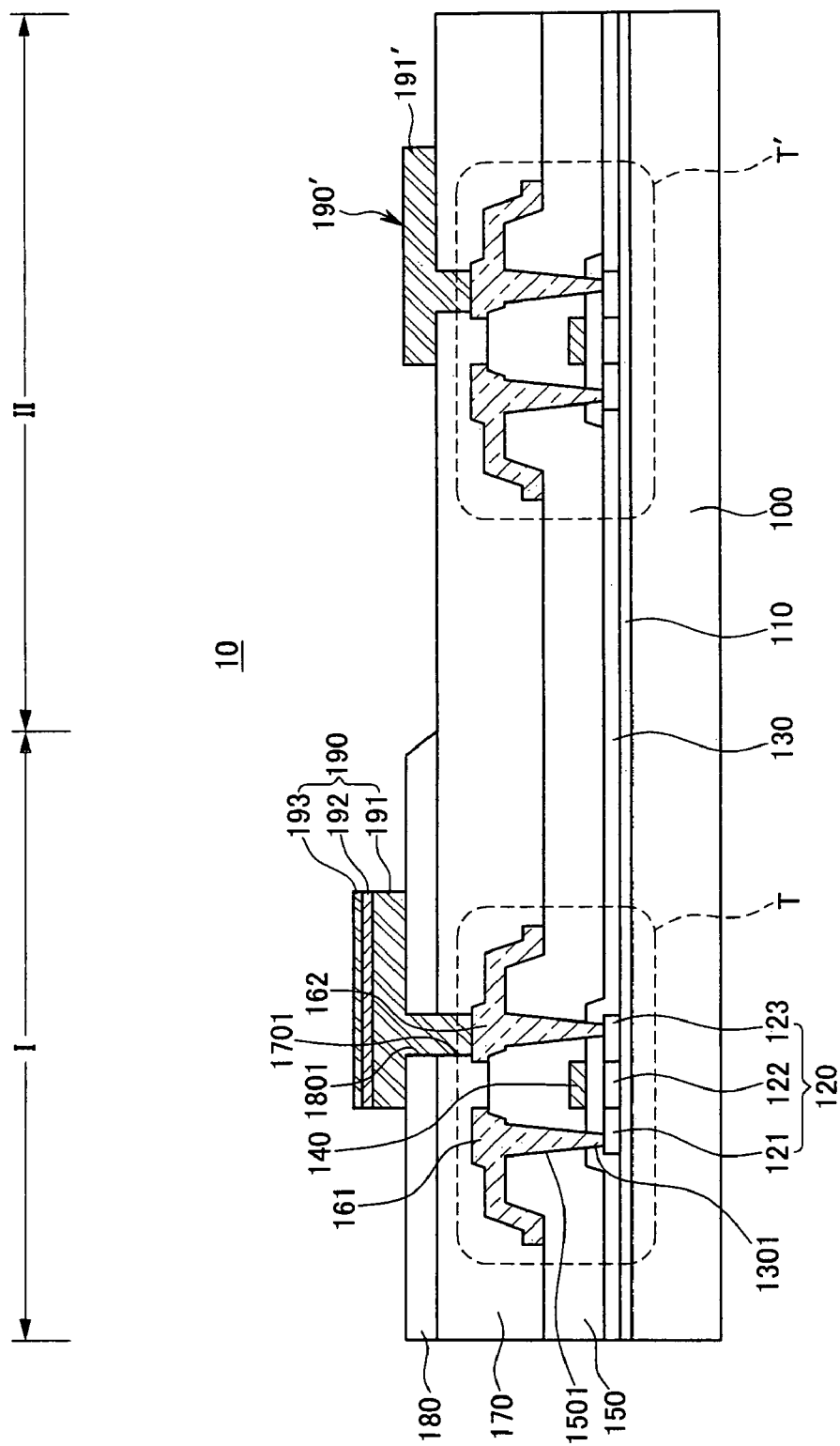

The reflective material layer 301 and the second electrode material layer 303 are patterned by the exposure/development process and the etching process using a mask formed by a reflective layer 192 and a second electrode layer 193 formed on the first electrode layer 191 in the first area I (refer to FIG. 1C).

Therefore, a first pixel electrode 190 including the first electrode layer 191, the reflective layer 192, and the second electrode layer 193 is formed in the first area I, and a first pixel electrode 190' including the first electrode layer 191' is formed in the second area II.

The first electrode layer 191 of the first area I and the first electrode layer 191' of the second area II may be thicker than the second electrode layer 193 of the first area I. More particularly, since a single layer of the first electrode layer 191' forms the first pixel electrode 190' in the second area II and functions as a main electrode, a thickness of the first electrode layer 191' is established to be within a range of 50 nm to 120 nm so that an electrode resistance problem does not occur.

Figure 1D:
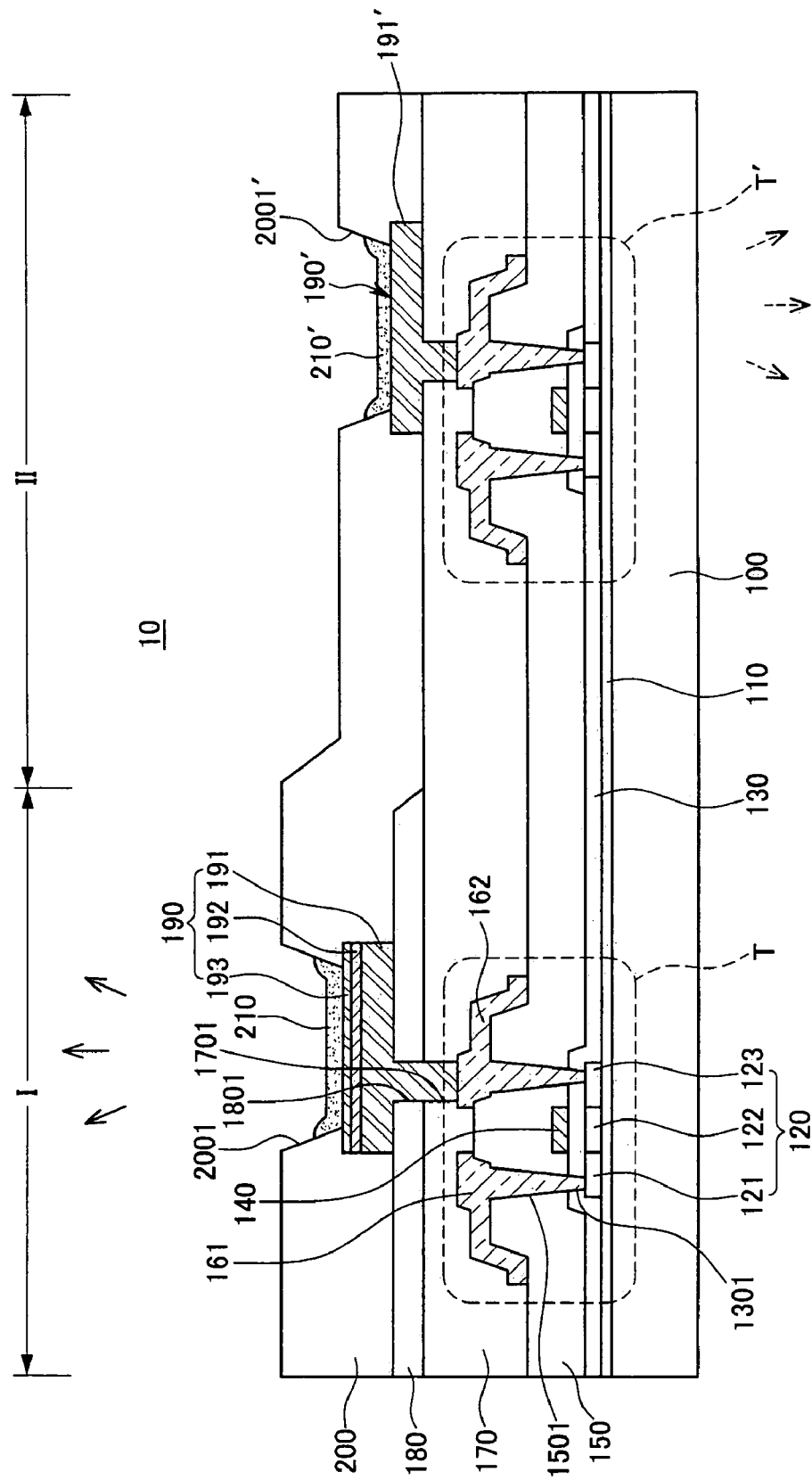

The reflective layer 192 of the first area I is formed on the first electrode layer 191 with respect to a light emitting direction (refer to a solid line arrow shown in FIG. 1D) of the first area I in the OLED display 10, and reflects light generated from an organic emission layer 210 shown in FIG. 1D and transmitted toward the substrate 100 so as to realize an image of the display device 10 on the top surface. In addition, the reflective layer 192 may be formed of a conductive material to increase luminous efficiency and electrical conductivity of the first pixel electrode 190.

For example, the reflective layer 192 may be formed of aluminum (Al), molybdenum (Mo), titanium (Ti), silver (Ag), magnesium (Mg), or gold (Au), or an alloy including at least one of these metals.

The second electrode layer 193 is formed on the reflective layer 192 to suppress oxidization of the reflective layer 192 and improve a work function between the organic emission layer 210 and the reflective layer 192. For example, the second electrode layer 193 may be formed of ITO, IZO, or Mg/Ag in a like manner of the first electrode layer 191. In addition, since the second electrode layer 193 functions as an auxiliary electrode in forming the first pixel electrode 190 of the first area I, the thickness of the second electrode layer 193 may be less than that of the first electrode layer 191.

The first pixel electrode 190' of the second area II is formed as a transparent conductive layer with respect to a light emitting direction of the second area II in the display device 10 (refer to a dotted line arrow shown in FIG. 1D). In the second area II, the light generated by the organic emission layer 210' is transferred toward the substrate 100 in which the TFT T' is formed, and therefore an image corresponding to the second area II is realized on a bottom surface of the display device 10.

Referring to FIG. 1D, a pixel defining layer 200 is commonly formed in the first area I and the second area II while covering the first pixel electrodes 190 and 190'. Openings 2001 and 2001' are formed in the pixel defining layer 200 in the exposure/development process and the etching process using a mask. The openings 2001 and 2001' are formed to correspond to the first pixel electrodes 190 and 190', and the first pixel electrodes 190 and 190' are partially exposed through the openings 2001 and 2001'.

The pixel defining layer 200 electrically separates the first pixel electrodes 190 and 190' of neighboring unit pixels.

Organic emission layers 210 and 210' are formed on the first pixel electrodes 190 and 190' through the openings 2001 and 2001' formed in the pixel defining layer 200.

The organic emission layers 210 and 210' may further include an organic layer positioned on an emission layer for actually emitting light, and upper and lower parts of the emission layer to efficiently transmit carriers including holes and electrons to the emission layer. For example, the organic layer may include at least one of hole injection and transport layers formed between the first pixel electrodes 190 and 190' and the emission layer, and at least one of electron injection and transport layers formed between the emission layer and the second pixel electrode 220.

Figure 1E:
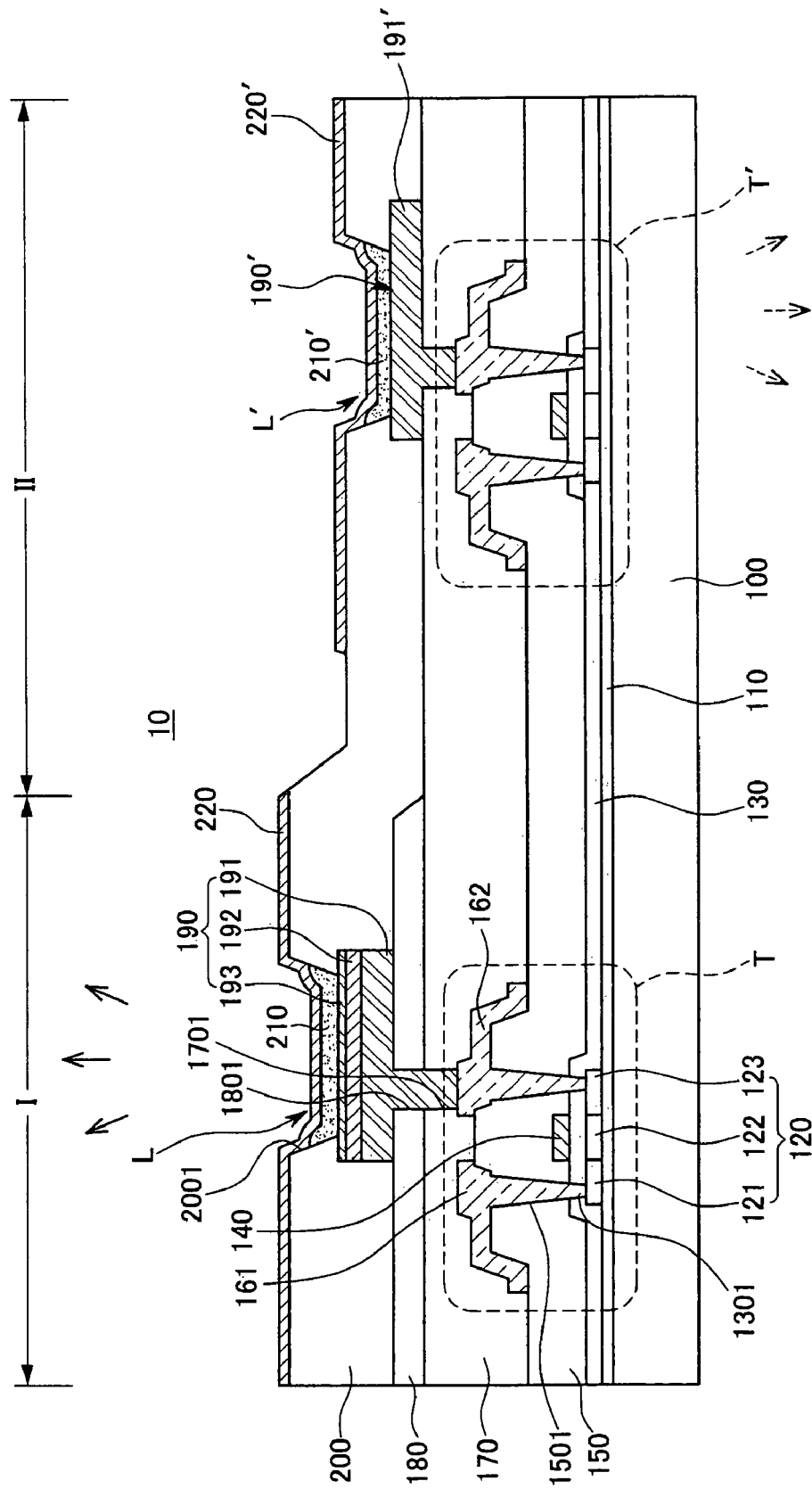

Referring to FIG. 1E, second pixel electrodes 220 and 220' are respectively formed in the first area I and the second area II. The second pixel electrodes 220 and 220' commonly provide a cathode voltage to the unit pixels of each area. For example, the first pixel electrodes 190 and 190' inject holes, and the second pixel electrodes 220 and 220' inject electrons. The first pixel electrodes 190 and 190', the organic emission layer 210, and the second pixel electrodes 220 and 220' are sequentially formed to form organic light emitting elements L and L'.

The second pixel electrode 220 of the first area I is formed as a transparent conductive layer along a light emitting direction of the organic light emitting element L of the first area I. For example, the transparent conductive layer may be formed of IZO, ITO, or MgAg. In addition, the second pixel electrode 220' of the second area II is formed as an opaque conductive layer along a light emitting direction of the organic light emitting element L'. For example, the opaque conductive layer may be formed of Al.

In addition, in the exemplary embodiment of the present invention, while it has been described that the second pixel electrodes 220 and 220' of the first area I and the second area II are respectively formed of different materials, the present invention is not limited thereto. When the second pixel electrodes are formed of the same material, the second pixel electrodes are formed on the top surface of the substrate including the first area I and the second area II to commonly provide a cathode voltage to the respective organic light emitting elements. The second pixel electrode may be formed as a transparent conductive layer, and in this case, an image may be realized on both surfaces (i.e., a substrate side and an opposite side thereof) in the second area II.

In addition, in the exemplary embodiment of the present invention, while it has been described that the first pixel electrode 190 has a multi-layered structure including the first electrode layer 191, the reflective layer 192, and the second electrode layer 193 in the first area I, the present invention is not limited thereto. If the first pixel electrode is formed of a material for forming a reflective electrode, a single layer structure may be formed.

While the present invention has been described in connection with what is presently considered to be a practical exemplary embodiment, it is to be understood that the present invention is not limited to the disclosed embodiment, but, on the contrary, is intended to cover various modifications and equivalent arrangements included within the spirit and scope of the appended claims.

What is claimed is:

1. A method of manufacturing a display device, comprising:
    preparing a substrate including a first area and a second area;
    forming a first layer on the first area and the second area;
    forming a second layer only on the first layer of the first area;
    respectively forming a first electrode layer on the second layer of the first area and the first layer of the second area;
    forming a reflective layer on the first electrode layer of the first area; and
    forming a second electrode layer on the reflective layer.

2. The method of manufacturing a display device of claim 1, wherein light emitting directions of the first and second areas are opposite to each other.

3. The method of manufacturing a display device of claim 1, wherein the first and second electrode layers of the first area are formed of a transparent material.

4. The method of manufacturing a display device of claim 1, wherein the first electrode layers formed in the first and second areas are respectively formed of a transparent material.

5. The method of manufacturing a display device of claim 1, wherein the first electrode layer of the first area is thicker than the second electrode layer.

6. The method of manufacturing a display device of claim 1, wherein the reflective layer is formed of aluminum (Al), molybdenum (Mo), titanium (Ti), silver (Ag), magnesium (Mg), or gold (Au), or an alloy including at least one of these metals.

7. The method of manufacturing a display device of claim 1, wherein the display device comprises:
    a first pixel electrode including the first electrode layer, the reflective layer, and the second electrode layer of the first area;
    an organic emission layer formed on the first pixel electrode;
    a second pixel electrode formed on the organic emission layer, and
    the second pixel electrode is formed of a transparent material.

8. The method of manufacturing a display device of claim 1, wherein the display device comprises:
    a first pixel electrode including the first electrode layer of the second area;
    an organic emission layer formed on the first pixel electrode;
    a second pixel electrode formed on the organic emission layer, and
    the second pixel electrode is formed of an opaque material.

9. The method of manufacturing a display device of claim 1, further comprising respectively forming a Thin Film Transistor (TFT) on the substrate in the first and second areas.

10. The method of manufacturing a display device of claim 9, wherein the first layer is a passivation layer formed on the substrate while covering the TFTs.

11. The method of manufacturing a display device of claim 10, wherein the second layer is a planarization layer formed on the passivation layer.

12. A display device, comprising:
- a substrate including a first area and a second area;
- a first layer disposed on both of the first area and the second area;
- a second layer disposed only on the first layer of the first area;
- a first electrode layer disposed on the second layer of the first area and on the first layer of the second area;
- a reflective layer disposed only on the first electrode layer of the first area; and
- a second electrode layer disposed only on the reflective layer.

13. The display device of claim 12, with the first layer having higher light transmittance compared to the second layer.

14. An organic light emitting diode display device, comprising:
- a substrate including a first area and a second area;
- a passivation layer disposed on both of the first area and the second area;
- a planarization layer disposed only on the passivation layer of the first area; and
- a multi-layer structure including a first electrode layer, a reflective layer and a second electrode layer, disposed only on the first area.

* * * * *